United States Patent [19]

Bernstein

[11] Patent Number: 5,170,122

[45] Date of Patent: Dec. 8, 1992

[54] NMR IMAGING USING FLOW COMPENSATED SSFP PULSE SEQUENCES

[75] Inventor: Matthew A. Bernstein, Waukesha, Wis.

[73] Assignee: General Electric, Milwaukee, Wis.

[21] Appl. No.: 735,419

[22] Filed: Jul. 25, 1991

[51] Int. Cl.⁵ ............................................. G01R 33/20
[52] U.S. Cl. ...................................... 324/309; 324/307; 324/306
[58] Field of Search ................ 324/300, 306, 307, 309, 324/312; 128/653 A, 653 AF

[56] References Cited

U.S. PATENT DOCUMENTS

| 4,665,365 | 5/1987 | Glover et al. | 324/309 |
| 4,800,889 | 1/1989 | Dumoulin et al. | 324/309 |
| 4,837,513 | 6/1989 | Yao | 324/309 |
| 4,952,877 | 8/1990 | Stormont et al. | 324/307 |
| 4,973,906 | 11/1990 | Bernstein | 324/309 |
| 4,992,736 | 2/1991 | Stormont et al. | 324/309 |
| 5,034,692 | 7/1991 | Laub et al. | 324/309 |

Primary Examiner—Louis Arana
Attorney, Agent, or Firm—Quarles & Brady

[57] ABSTRACT

A steady-state free procession fast NMR pulse sequence includes a readout gradient waveform which refocuses the transverse magnetization to produce an S− NMR signal during the subsequent pulse sequence. A partial echo signal acquisition is acquired which enables the pulse sequence to be shortened and enables the S+ NMR signal to be displaced from the data acquisition window without disturbing the flow compensation. View reordering is used in combination with phase cycling to suppress the S+ NMR signal.

7 Claims, 5 Drawing Sheets

NMR IMAGING USING FLOW COMPENSATED SSFP PULSE SEQUENCES

BACKGROUND OF THE INVENTION

The field of the invention is nuclear magnetic resonance imaging methods and systems. More particularly, the invention relates to flow compensation of steady-state free precession pulse sequences.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or traverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulse NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques and they are characterized by a cyclic pattern of transverse magnetization in which the resulting NMR signal refocuses at each RF excitation pulse to produce an echo signal. This echo signal includes a first part S+ that is produced after each RF excitation pulse and a second part S— which forms just prior to the RF excitation pulse.

There are two well known SSFP pulse sequences used to produce images. The first is called gradient refocused acquired steady-state (GRASS) and it utilizes a readout gradient $G_x$ to shift the peak in the S+ signal that is produced after each RF excitation pulse toward the center of the pulse sequence. This pulse sequence is shown in FIG. 1 where the NMR signal is an S+ gradient echo that is induced by the readout gradient $G_x$. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data, and to preserve the steady-state equilibrium. The effects of the phase encoding gradient pulse are nullified by a corresponding $G_y$ rewinder gradient pulse after the NMR signal has been acquired and before the next pulse sequence begins as described in U.S. Pat. No. 4,665,365.

The second well known SSFP pulse sequence is called contrast enhanced fast imaging (SSFP-ECHO) and it utilizes the S— signal that is produced just prior to each RF excitation pulse. This pulse sequence is shown in FIG. 2 where the acquired NMR signal is an S— echo signal caused by the gradient refocusing of the transverse magnetization which would otherwise refocus at the next RF excitation pulse. The readout gradient $G_x$ is substantially different in this pulse sequence and includes a positive pulse prior to the actual readout pulse and a negative pulse after the readout pulse. The former pulse dephases the FID signal (S+) which might otherwise be produced during the data acquisition window, and the latter pulse causes the transverse magnetization to rephase during the next pulse sequence to produce the echo signal S— during the acquisition window. For a more detailed discussion of the SSFP-ECHO or S— pulse sequence, reference is made to an article by R. C. Hawkes and S. Patz entitled "Rapid Fourier Imaging Using Steady-State Free Precision", published in *Magnetic Resonance in Medicine* 4, pp. 9-23 (1987).

In addition to being a very short pulse sequence which enables a complete scan to be carried out in a few seconds, the S— sequence has an attribute which makes it more useful than the GRASS pulse sequence in many medical applications. More specifically, the S+ signal acquired with the GRASS pulse sequence has an amplitude which is approximately a function of the ration $T_2/T_1$, while the S— signal acquired by the S— pulse sequence has additional $T_2$ dependence. As a result, S— is a $T_2$ weighted pulse sequence which provides better contrast between tissues of differing $T_2$. Since $T_2$ is a good indicator of diseased tissues, the S— pulse sequence provides better contrast between normal tissues and diseased tissues in the reconstructed image.

Unfortunately, the S— pulse sequence also is more susceptible to distortions, or artifacts, which are produced in the reconstructed image as a result of moving spins. For example, blood flow in the direction of the readout gradient is incorrectly position encoded, and the signals produced by the flowing spins are thus positioned incorrectly in the reconstructed image. This increased sensitivity to motion and flow artifacts is due to the fact that the S— signal is produced by transverse magnetization which is created by RF excitation pulses generated during previous pulse sequences. Over the extended time (>2TR) between excitation and readout, the gradient fields produce large dipolar moments which sensitize the S— signal to flow and motion.

In my prior invention which is disclosed in U.S. Pat. No. 4,973,906 entitled "Flow Compensated NMR Fast Pulse Sequence," I disclose a S— pulse sequence which is flow compensated. Referring to FIG. 3 in this application, the $G_x$ readout gradient pulse in this prior art invention is comprised of a central positive gradient pulse 10, a leading negative gradient pulse 11, and a trailing negative gradient pulse 12. The readout pulse 10 refocuses the S— NMR signal and it frequency encodes the acquired data in the well known manner. The trailing negative gradient pulse 12 dephases the spins and sets up the production of the S— NMR signal during the next pulse sequence. A teaching of this prior invention is that the leading negative gradient pulse 11 is chosen so as to flow compensate the readout gradient and thereby reduce the production of flow artifacts. In practice this compensation cannot be accomplished completely and a compromise value is used.

SUMMARY OF THE INVENTION

The present invention relates to an improved SSFP-ECHO pulse sequence in which the acquired S— NMR signal is separated from the S+ NMR signal and is less susceptible to motion artifacts. More specifically, the present invention is an NMR pulse sequence in which the readout gradient has a trailing negative lobe which cooperates with the readout gradient in the subsequent pulse sequence to refocus the S— NMR signal, a leading negative lobe which is selected to reduce sensitive to motion and to move the S+ NMR signal out of the data acquisition window, and in which a partial echo data acquisition is performed to reduce the size of the readout gradient lobes and to thereby reduce the size of any residual dipolar moments that are not fully compensated. In yet another aspect of the present invention, interference in the reconstructed image caused by the S+ NMR signal is substantially reduced by phase cycling, and the desired steady state condition is not disturbed by such phase cycling by altering the order of the phase encoding sequence during the scan.

A general object of the invention is to flow compensate the readout gradient in a steady-state free precession fast NMR pulse sequence. By performing a partial NMR echo signal acquisition during each pulse sequence the size of the readout gradient lobes can be reduced. Since it is these which produce the motion sensitizing dipolar gradient moments, by reducing their size the task of flow compensating the pulse sequence is reduced. This also enables the leading negative readout gradient lobe to be increased in size to drive the S+ NMR signal out of the acquisition window without significant motion or flow artifacts.

Another object of the invention is to reduce the need for "crusher" gradient pulses in the slice select and phase encoding directions. By driving the S+ signal out of the acquisition window there is less need for crusher gradient pulses to dephase the S+ signal. This in turn reduces the power demands on the gradient amplifiers and enables the pulse sequence to be further shortened.

Yet another object of the invention is to reduce interference from the S+ NMR signal without disrupting the steady state condition required in a scan performed with a S— pulse sequence. By performing a scan in which the phase of the RF excitation pulses are alternated from view to view and combining the NMR data with NMR data acquired from a scan in which the phase is not alternated, the S+ NMR signal may be suppressed. One cannot interleave the acquisition of views from these two scans without disrupting the steady state conditions, and consequently, a considerable time elapses between the acquisition of corresponding views in each scan. During that time, motion due to patient respiration and the like can occur which disrupts the phase cycling process. It is a teaching of the present invention that this problem can be minimized by acquiring the central phase encoding views during the last part of the first scan and the first part of the second scan.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
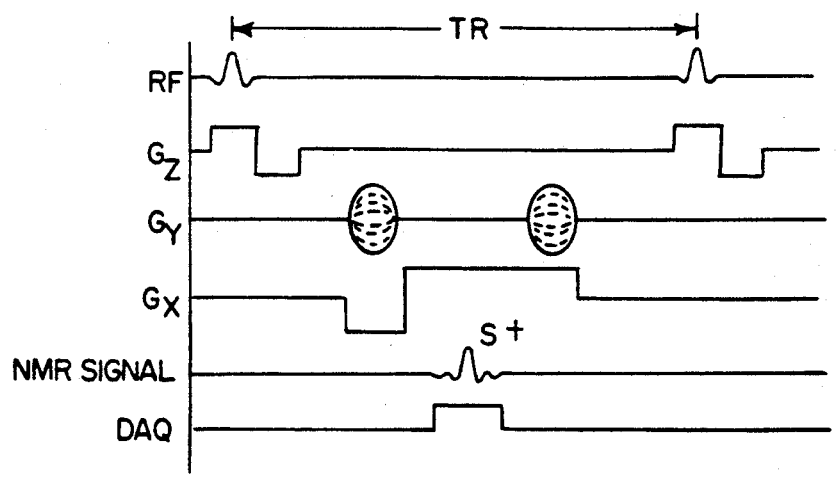
FIGS. 1-3 are graphic representations of prior art SSFP pulse sequences.
Figure 2:
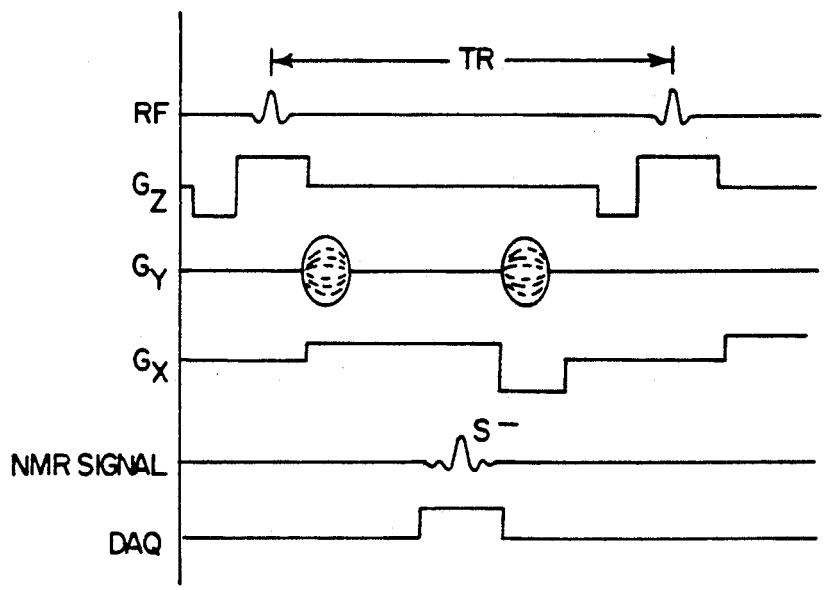
Figure 3:
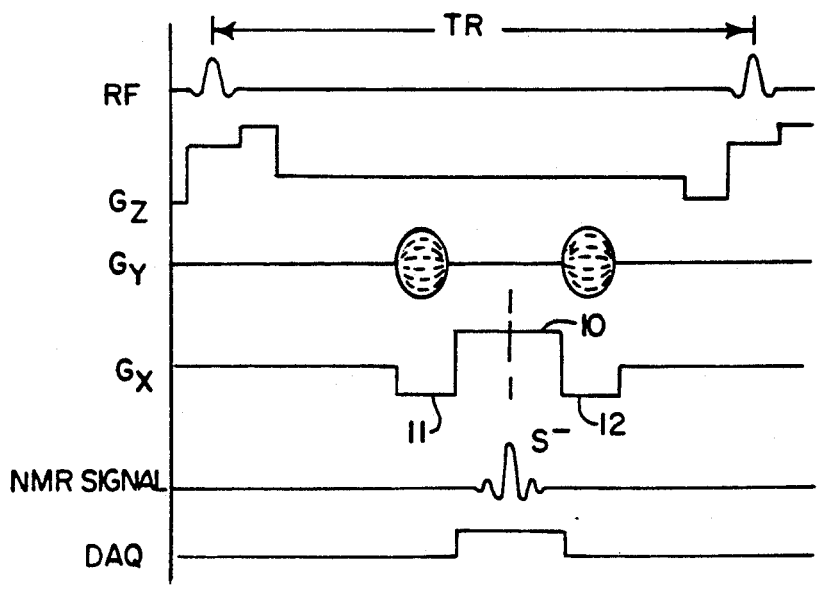
Figure 4:
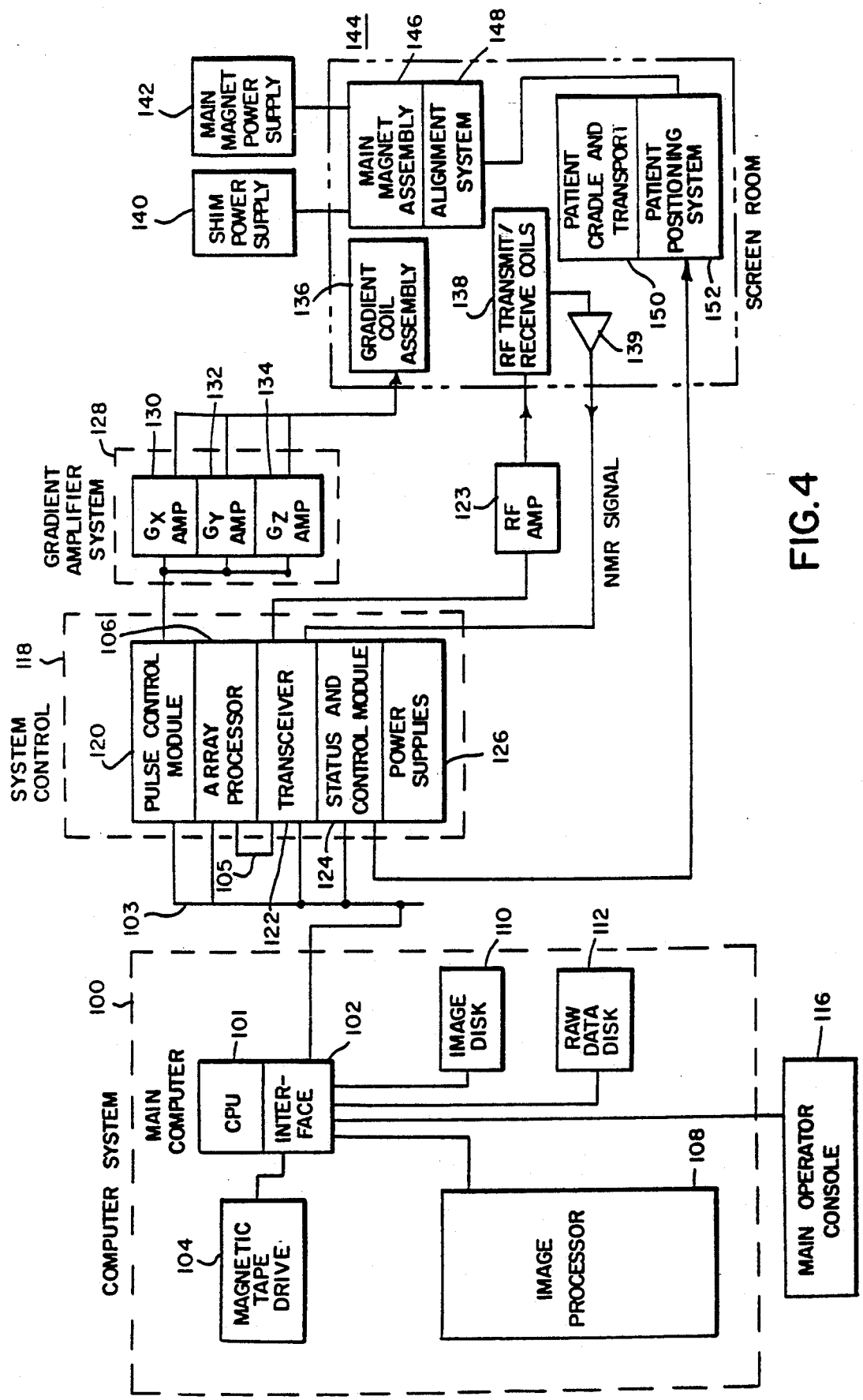
FIG. 4 is a block diagram of a NMR system which employs the present invention.

Referring first to FIG. 4, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnetic assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 5:
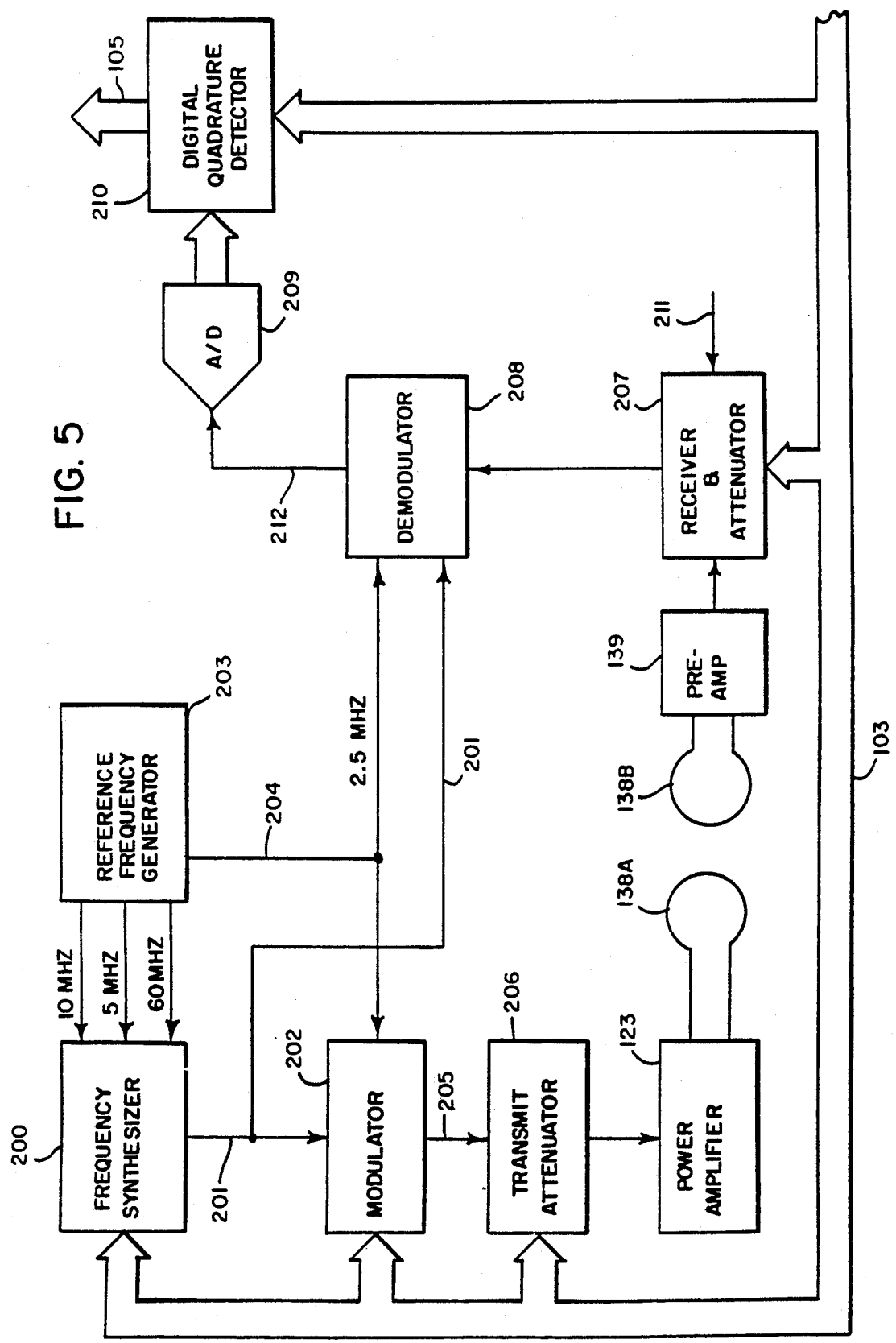
FIG. 5 is an electrical block diagram of the transceiver which forms part of the NMR system of FIG. 4.

Referring particularly to FIGS. 4 and 5, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 4 and 5 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

The A/D converter 209 is operated by the pulse control module 120 to sample the received NMR echo signal. The pulse control module 120 applies a stream of pulses that determine the rate of the sampling, the duration of the sampling and the total number of samples. As will be explained below, the control of the data acquisition window relative to the production of the NMR echo signal is an important aspect of this invention.

Figure 6:
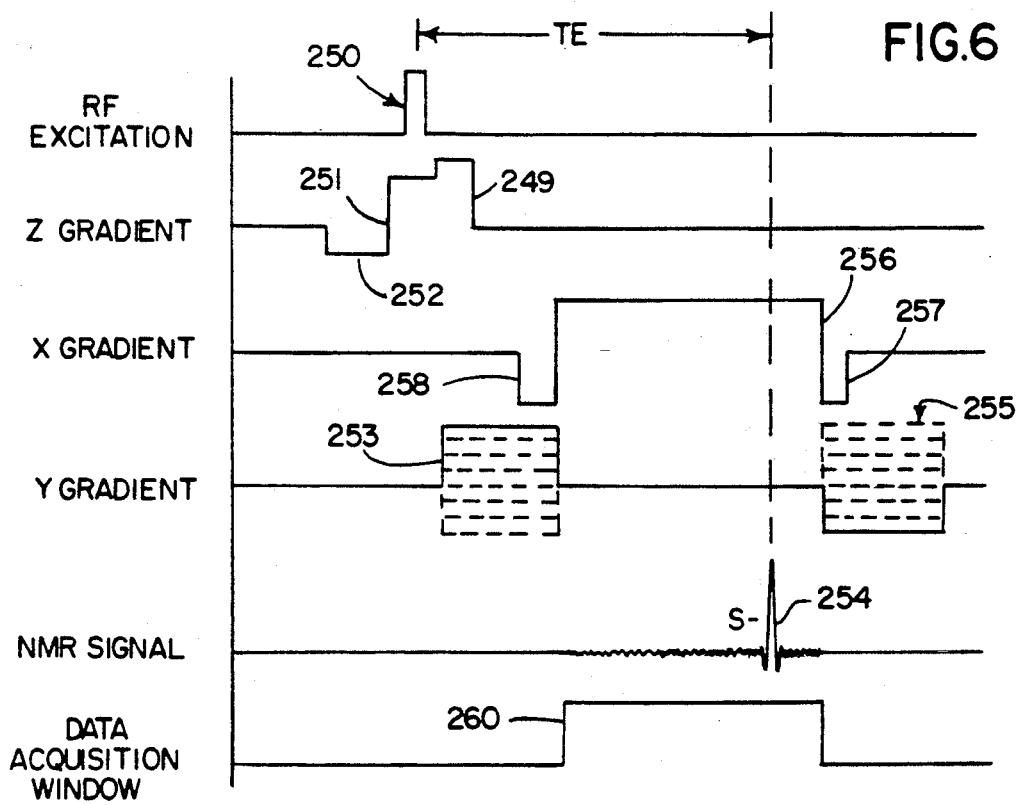
FIG. 6 is a graphic representation of a preferred pulse sequence for implementing the present invention.

The NMR system of FIG. 4 performs a series of pulse sequences to collect sufficient NMR data to reconstruct an image. A fast pulse sequence which implements a preferred embodiment of the present invention is shown in FIG. 6. It is characterized by a series of RF excitation pulses 250 which have a magnitude and duration sufficient to tip the net magnetization by an angle of from 10° to 90° depending on the contrast which is desired in the reconstructed image. The RF excitation pulses 250 of each successive pulse sequence are spaced apart by a very short repetition time (TR) typically in the range of 20 to 50 milliseconds. This repetition time is less than the spin-spin relaxation time $T_2$ of water and tissue and a steady-state equilibrium is established after a few pulses in which the transverse magnetization cycles between a maximum, a minimum and back to a maximum during each interval TR.

The pulse sequence of FIG. 6 is employed with a 2DFT image reconstruction technique and it uses the z axis magnetic field gradient $G_z$ to select a slice of spins for the measurement. More specifically, the RF excitation pulses 250 are selective, and a $G_z$ gradient pulse 251 is produced at the same time to excite spins in the desired slice. The $G_z$ gradient is then increased at 249 to deliberately dephase both stationary and moving spins, and to thereby suppress the S+ NMR signal that is otherwise produced after each RF excitation pulse 250. A $G_z$ gradient rephasing pulse 252 is produced just prior to each slice select pulse 251 to rephase the spin prior to the subsequent readout of the S− NMR signal.

Position along the Y axis is phase encoded into the S− NMR signal for the next TR interval by a $G_y$ phase encoding gradient pulse 255. This phase encoding occurs before the S− NMR signal 254 is acquired during the subsequent pulse sequence, and a second $G_y$ pulse 253 rewinds, or rephases, the spins to maintain equilibrium. These phase encoding pulses 253 and 255 have equal amplitude and opposite sign. Their amplitudes are changed from view-to-view to acquire NMR data for a complete scan.

Positioned between these phase encoding gradient pulses 253 and 255 is a readout gradient pulse 256 which is applied as the S− NMR signal 254 is acquired. This readout gradient pulse 256 refocuses the S− NMR signal and it frequency encodes the acquired data in the well known manner. In addition, a negative $G_x$ gradient pulse 257 is produced after the readout pulse 256 to dephase the spins and set up the production of the S− NMR signal 254 during the next pulse sequence. A negative $G_x$ gradient pulse 258 is produced just prior to the readout gradient pulse 256. This pulse 258 is larger than the negative pulse 257 as described in U.S. Pat. No. 4,973,906 in order to partially flow compensate the readout gradient.

It should be apparent to those skilled in the art that while a 2D pulse sequence is employed in the preferred embodiment of the invention, a 3D implementation is also possible. In such case we add a pair of $G_z$ phase encoding pulses (not shown) which are cycled through a set of discrete values during the scan as is done with the $G_y$ phase encoding gradient pulses 253 and 255.

Referring still to FIG. 6, an important aspect of the present invention is the asymmetric, or partial, acquisition of the NMR echo signal 254. It is readily apparent that the center of the NMR echo signal 254 which occurs at echo time TE is not in the center of the data acquisition window indicated at 260. Instead, it is shifted to the right of center such that all of the NMR echo signal prior to its peak is acquired, but only a portion of the echo signal following the peak is acquired. This asymmetric acquisition not only shortens the pulse sequence, but it enables the pulse sequence to be flow compensated more accurately. More specifically, the later production of the NMR echo signal 254 is accomplished by reducing the negative pulse 257 on the readout gradient, and this reduction in turn reduces the magnitude of the flow compensation problem. In addition, if the area of the forward negative readout gradient pulse 258 is increased beyond the area of the readout gradient lobe 256, then the S+ signal is pulsed out of the data acquisition window. Since the S+ signal is pulsed out of the data acquisition window, crusher gradient pulses on the y and z axes, such as the gradient pulse 249, can be significantly reduced. Such crusher gradient pulses can lead to unwanted flow artifacts in the reconstructed image. Thus, the use of the partial echo acquisition which allows a reduction in the size of gradient lobe 257 and the delay of the S+ signal by increasing the size of the gradient lobe 258 results in an S− pulse sequence which is more easily flow compensated.

Figure 7:
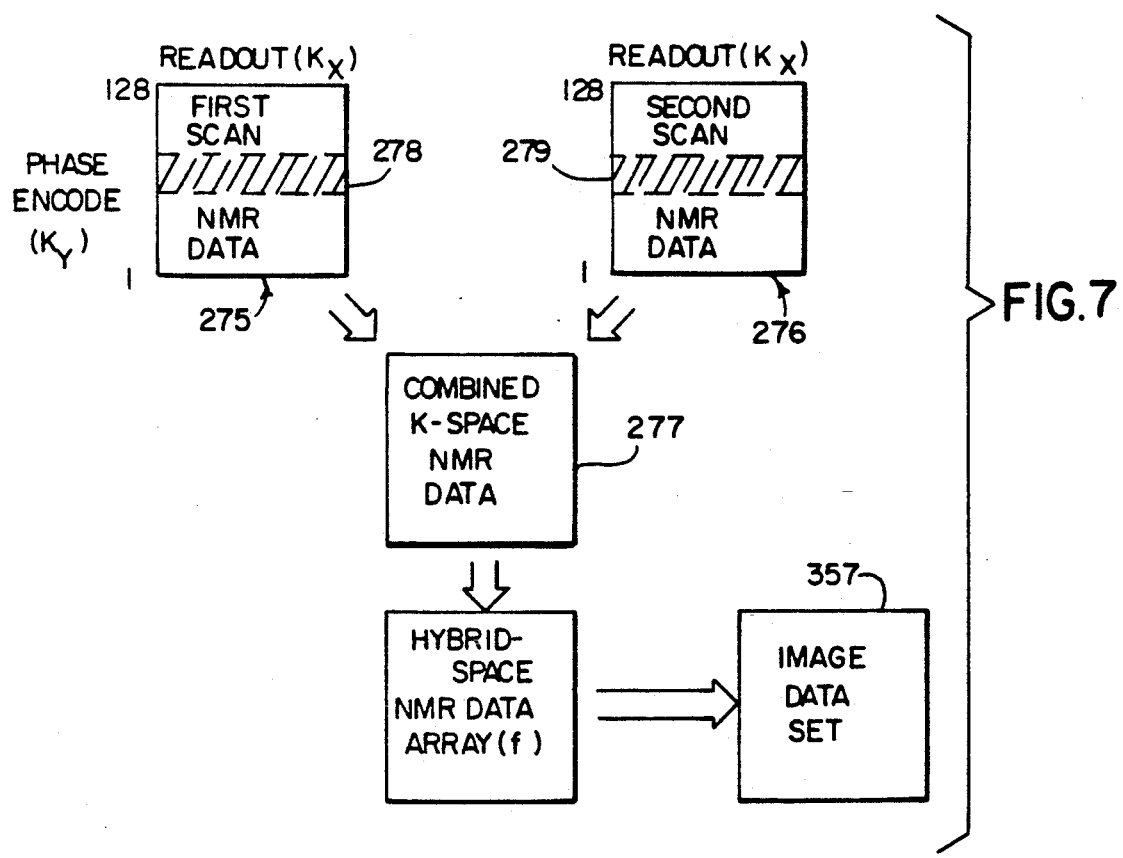
FIG. 7 is a pictorial representation of the data structures which are produced when the present invention is employed in the NMR system of FIG. 4.

As indicated above, a scan is performed by acquiring a set of NMR echo signals which have been separately phase encoded. Such a complete NMR data set may include, for example, sampled signals from 128 separately phase encoded "views," with each view containing 128 separate frequency encoded samples. Such an NMR data set is illustrated in FIG. 7 as a data structure 275 which stores the acquired NMR data from a first scan. The data structure 275 is stored in the array processor 106 (FIG. 7) and is comprised of 128 rows corresponding to each separate phase encoding value ($k_y$) and 128 columns corresponding to each frequency encoding value ($k_x$). Each stored sample is a 16-bit I value and a 16-bit Q value as described above. Typically, this data is acquired one row at a time by incrementing the phase encoding gradient sequentially through its values $k_y=1$ to $k_y=128$.

A known method for reducing interference from the S+ NMR signal is to employ phase cycling techniques. Phase cycles can be used to separate the S+ and S− NMR signals without the use of crusher gradient pulses. One such technique is described by G. Laub and M. Deimling in SMRI abstract 403, 1989 that uses two separate scans of k-space: one space with all the RF excitation pulses having the same phase; and the other scan with the RF excitation pulse phase in alternate views reversed by 180°. The data in the two resulting NMR data sets is then combined to suppress the S+ NMR signal. This technique is illustrated in FIG. 7, where the NMR data set 275 is acquired during a first scan using a fixed RF excitation pulse phase and a second NMR data set 276 is acquired during a second scan using RF excitation pulses which alternate in phase by 180°. These two NMR data sets 275 and 276 are combined as taught in the above-referenced publication to form a single k-space NMR data set 277 in which the S+ NMR signals have been suppressed.

To maintain that the steady state conditions produced by the SSFP-ECHO pulse sequence of FIG. 6 during these scans, it is necessary that the views in each data set 275 and 276 not be interleaved. As a result, views in the second NMR data set 276 are acquired at a substantial time interval after the corresponding views are acquired during the first scan. If there is significant patient movement during this time interval, the reconstructed image is degraded when it is reconstructed from the combined NMR data set. Such patient motion is typically produced by respiration and the cardiac cycle.

It is a teaching of the present invention that the problem can be significantly reduced by re-ordering the sequence in which the views of each scan are acquired. More particularly it is known that the central views indicated at 278 and 279 in FIG. 7 contribute most strongly to the shape of large objects in the reconstructed image, while the peripheral views in each acquired data set 275 and 276 contribute to the definition of small objects and fine detail in the image. It has been discovered that the degradation of image quality due to patient motion can be significantly reduced if the central views 279 in the second scan are acquired immediately after the acquisition of the central views 278 in the first scan.

In the preferred embodiment this re-ordering of the acquisition of the two NMR data sets 275 and 276 is performed on the central ten views. More specifically, the first scan is performed in the following view order:
1-59, then 70-128, then 60-69;
and the second scan is performed immediately thereafter in the following order:
60-69, then 1-59, and then 70-128.

In an alternative embodiment of the invention the following view order is employed with similar results:
first scan—1, 128, 2, 127, ... 60, 69, 61, 68, 62, 67, 63, 66, 64, 65;
second scan—64, 65, 63, 66, 62, 67, 61, 68, 60, 69 ... 1, 128.

This is a variation of the centric view ordering described by A. E. Holsinger and S. J. Riederer "The Importance Of Phase Encoding Order In Ultra-Short TR Snapshot MR Imaging" in *Magnetic Resonance in Medicine*, pgs. 481-88 (1990).

The important fact is that the central ten views (60–69) are acquired as close in time to one another as possible without disturbing the steady state equilibrium of the magnetization.

While the view orders described above are particularly useful in S− imaging, it should be apparent that they are also useful in any NMR measurement which requires that k-space by scanned twice and motion or flow image artifacts are to be minimized.

Referring still to FIG. 7, the combined k-space NMR data set 277 which is formed from the data acquired in these two scans is Fourier transformed to reconstruct an image. However, because only a partial NMR echo signal 254 (FIG. 6) has been acquired, the data set 277 is not completely filled and a modification to the conventional two-dimensional Fourier transformation method of image reconstruction is made in the preferred embodiment of the invention.

Figure 8:
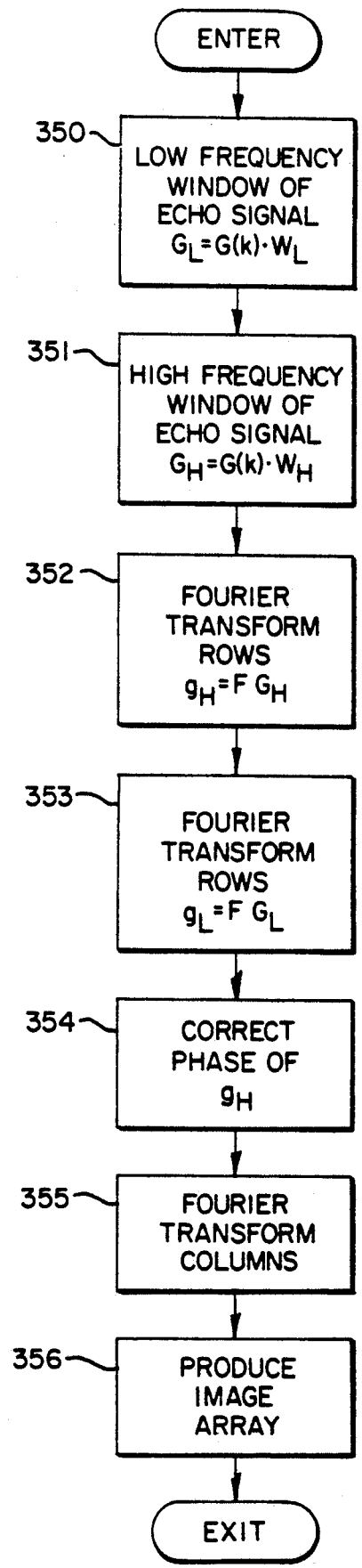
FIG. 8 is a flow chart of the program which reconstructs an image from the NMR data acquired according to the present invention.

More specifically, the NMR data set 277 is employed to produce an image using a homodyne reconstruction technique. This is accomplished under the direction of a program which is executed by the computer 101 (FIG. 4) and which is illustrated in FIG. 8.

The first step in the reconstruction process is to produce two separate data sets $(G_L)$ and $(G_H)$ from the NMR data set 277 $(G_K)$. This is accomplished by multiplying each row of the NMR data set 277 by the following low frequency window function $W_L$:

$$W_L = (1+e^{(k-k1)/T})^{-1} - (1+e^{(k+k1)T/})^{-1} \quad (1)$$

where:
T = 4 in the preferred embodiment;
$k_1$ = 18 in the preferred embodiment; and
k = the position of the value being windowed along the readout dimension $(k_x)$, where k = −64 to 64.

The 128 values $(G_K)$ in each row of the NMR data set 277 (including the zero-filled points) are multiplied by the value of the window function $W_L$ as indicated at process block 350 to produce a separate array $G_L$.

$$G_L = W_L \cdot G_K \quad (2)$$

Similarly, as indicated at process block 351, each value $G_K$ in the NMR data set 277 is also multiplied by a high frequency window $W_H$ as follows:

$$G_H = W_H \cdot G_K \quad (3)$$

where:
$$W_H = 2 - (1+e^{(k-k1)/T})^{-1} - (1+e^{(k+k1)T/})^{-1}, \quad (4)$$

T = 4
$k_1$ = 18
k = the position of the value being windowed along the readout dimension $(k_x)$, where k = −64 to 64.

Each of the 128 by 128 element data arrays $G_L$ and $G_H$ are then separately Fourier transformed as indicated by process blocks 352 and 353. These are complex Fourier transformations along the horizontal, row direction as would normally be performed in a 2DFT reconstruction. Two, separate 128 by 128 element arrays $g_H$ and $g_L$ result. Due to the hermetian symmetry property of the Fourier transformation process, the zero filled portion of the NMR data set 277 is filled in by the transformation process and the transformed data in the array $g_H$ is complete and sufficient to produce an image. However, spatially dependent phase shifts present in the image must be corrected. The data in the transformed data array $g_L$ contains the low frequency phase information necessary to make this correction. This is based on the assumption that the spatially dependent phase shifts have primarily a low frequency variation and can be approximated by the phase of the data array $g_L$. The next step in the process, therefore, is to correct the phase of the array elements $g_H$ as indicated at process block 354. This can be performed in a number of ways, but it is in essence a process in which the phase $(\phi_H)$ of each complex element in the transformed array $g_H$ is changed by the phase $(\phi_L)$ of the corresponding element in the transformed array $g_L$. This is performed as follows in the preferred embodiment:

$$f_x = g_H \cdot |g_L| / g_L \quad (5)$$

where $f_x$ is the complex value of each element in a 128 by 128 element array (f) which represents the NMR image data in hybrid-space.

As indicated in FIGS. 7 and 8 at process block 355, the next step is to Fourier transform the hybrid-space array f in the column, or phase encoding direction. This is a complex Fourier transformation as is done in a conventional 2DFT reconstruction, and it produces a 128 by 128 element image data set 357 which is employed to produce the desired image.

I claim:

1. In an NMR system for applying a polarizing magnetic field, a plurality of magnetic field gradients and an RF excitation field to a subject located in a region of interest and for receiving NMR signals from the subject and reconstructing an image from such NMR signals, a method for operating the NMR system which includes the execution of a series of steady-state free precession pulse sequences which comprise:

(a) applying a substantially constant and homogeneous polarizing magnetic field to the region of interest during the entire pulse sequence;
(b) applying an RF excitation field pulse to the region of interest;
(c) applying a phase encoding magnetic field gradient pulse to the region of interest;
(d) applying a readout magnetic field gradient pulse to the region of interest; the readout magnetic field gradient pulse having a central lobe of one polarity and leading and lagging lobes of the opposite polarity disposed to the respective leading and lagging sides of the central lobe, the magnitude of the trailing lobe being selected to produce a peak in the S−

NMR signal during the application of the central lobe of the readout magnetic field gradient pulse during the next pulse sequence, which peak at asymmetrically aligned toward the trailing edge of the central lobe, and the magnitude of the leading lobe of the readout magnetic field gradient being selected to misalign the peak in the S+ NMR signal with the central lobe of the readout magnetic field gradient pulse; and (e) acquiring an NMR signal during the production of the central lobe of the readout magnetic field gradient pulse;

wherein the NMR signals acquired during the series of pulse sequences are employed to reconstruct an image of the subject in the region of interest.

2. The method as recited in claim 1 in which the reconstruction of the image from the acquired NMR signals is accomplished by performing a homodyne corrected Fourier transformation on the acquired NMR signals.

3. In an NMR system for applying a polarizing magnetic field, a plurality of magnetic field gradients and an RF excitation field to a subject located in a region of interest and for receiving NMR signals from the subject and reconstructing an image from such NMR signals, a method for operating the NMR system which includes the execution of a series of steady-state free precession pulse sequences which comprise:

(a) applying a substantially constant and homogeneous polarizing magnetic field to the region of interest during the entire pulse sequence;

(b) applying a RF excitation field pulse to the region of interest;

(c) applying a phase encoding magnetic field gradient pulse to the region of interest;

(d) applying a readout magnetic field gradient pulse to the region of interest, the readout magnetic field gradient pulse having a central lobe of one polarity and leading and trailing lobes of the opposite polarity disposed to the respective leading and trailing sides of the central lobe, the magnitude of the trailing lobe being selected to produce a peak in the S− NMR signal during the application of the central lobe of the readout magnetic field gradient pulse during the next pulse sequence, which peak at asymmetrically aligned toward the trailing edge of the central lobe; and (e) acquiring an NMR signal during the production of the central lobe of the readout magnetic field gradient pulse;

wherein a first series of said steady-state free precession pulse sequences is executed to acquire a first scan NMR data set in which each acquired NMR signal is separately phase encoded and the order of the phase encoding is selected such that a set of central phase encoded NMR signals are acquired last;

wherein a second series of said steady-state free precession pulse sequences is executed to acquire a second scan NMR data set in which each acquired NMR signal is separately phase encoded and the order of the phase encoding is selected such that the corresponding central set of phase encoded NMR signals are acquired first; and wherein corresponding acquired signals in the first and second scan NMR data sets are combined to form a combined k-space NMR data set in which an S+ NMR signal is suppressed relative to the acquired S− NMR signal; and wherein an image is reconstructed from the combined k-space NMR data set.

4. The method as recited in claim 3 in which the phase of the RF excitation field pulses produced during the first series of steady-state free precession pulse sequences is different from the phase of the RF excitation field pulses produced during the second series of steady-state free precession pulse sequences.

5. The method as recited in claim 3 in which the reconstruction of the image is accomplished by performing a homodyne corrected Fourier transformation on the combined k-space NMR data set.

6. The method as recited in claim 3 in which the magnitude of the leading lobe on the readout magnetic field gradient pulse is selected to minimize the first moment of the readout magnetic field gradient pulse.

7. In an NMR system for applying a polarizing magnetic field, a plurality of magnetic field gradients and an RF excitation field to a subject located in a region of interest and for acquiring NMR signals from the subject and reconstructing an image from such NMR signals, a method for operating the NMR system which includes the execution of a series of pulse sequences in which a phase encoding gradient pulse is stepped through a sequence of values to scan k-space twice, the improvement comprising:

stepping the phase encoding gradient pulse through a first sequence of values to scan k-space a first time and in which the pulse sequences having phase encoding gradient pulse values that acquire NMR signals from a central portion of k-space are executed last; and stepping the phase encoding gradient pulse through a second sequence of values to scan k-space a second time and in which the pulse sequences having phase encoding gradient pulse values that acquire NMR signals from the central portion of k-space are executed first.

* * * * *

UNITED STATES PATENT AND TRADEMARK OFFICE
CERTIFICATE OF CORRECTION

PATENT NO. : 5,170,122
DATED : Dec. 8, 1992
INVENTOR(S) : Matthew A. Bernstein

It is certified that error appears in the above-identified patent and that said Letters Patent is hereby corrected as shown below:

On the Title page, item [57]

In The Abstract:

Line 1 "free procession" should be --free precession--.

Column 1, Line 27 "traverse" should be --transverse--.

Column 1, line 68 "pulse" should be --pulsed--.

Column 3, line 49 "ration" should be --ratio--.

Column 4, line 7 "prior art invention"
    should be --prior invention--.

Column 4, line 31 "sensitive" should be --sensitivity--.

Column 9, line 63 "is pulsed" should be --is pushed--.

Column 9, line 65 "is pulsed" should be --is pushed--.

Column 10, line 16 "FIG. 7" should be --FIG. 4--.

Column 10, line 30 "one space" should be --one scan--.

Column 11, line 27 "by scanned" should be --be scanned--.

UNITED STATES PATENT AND TRADEMARK OFFICE
CERTIFICATE OF CORRECTION

PATENT NO. : 5,170,122
DATED : Dec. 8, 1992
INVENTOR(S) : Matthew A. Bernstein

It is certified that error appears in the above-identified patent and that said Letters Patent is hereby corrected as shown below:

Column 11, line 49 "$W_L = (1+e^{k+k1)/T})-1 - (1+e^{k+k1)T/})-1$ should be -- $W_L = (1+e^{(k-k_1)/T})-1 - (1+e^{(k+k_1)T/})-1$ --.

Column 12, line 2 "$W_H = 2-(1+e^{(k-k1)/T})-1 - (1+e^{(k+k1)T/})-1$ should be -- $W_H = 2 - (1+e^{(k-k_1)/T})-1 - (1+e^{(k+k_1)T/})-1$ --.

Column 13, line 45 "which peak at" should be --which peak is--.

Signed and Sealed this

Ninth Day of November, 1993

Attest:

BRUCE LEHMAN

Attesting Officer          Commissioner of Patents and Trademarks